United States Patent
Wong et al.

[11] Patent Number: 5,160,794
[45] Date of Patent: * Nov. 3, 1992

[54] SUPERCONDUCTOR AND PROCESS OF MANUFACTURE

[75] Inventors: James Wong, Wayland; Mark K. Rudziak, Westminister; Donald W. Capone, II., Northbridge, all of Mass.

[73] Assignee: Composite Materials Technology, Inc., Shrewsbury, Mass.

[*] Notice: The portion of the term of this patent subsequent to Oct. 27, 2009 has been disclaimed.

[21] Appl. No.: 540,193

[22] Filed: Jun. 19, 1990

Related U.S. Application Data

[63] Continuation-in-part of Ser. No. 480,236, Feb. 15, 1990, which is a continuation-in-part of Ser. No. 363,634, Jun. 8, 1989, Pat. No. 4,925,741.

[51] Int. Cl.$^5$ .................. C22C 1/18; H01L 39/12; H01L 39/24; H01B 12/02
[52] U.S. Cl. .................................. 428/661; 428/930; 148/96; 29/599; 505/814; 505/918; 505/921
[58] Field of Search ............... 428/430, 660, 661, 662, 428/610, 614; 148/11.5 Q, 11.5 F; 29/599; 505/812, 813, 919, 921, 918, 814.1; 419/6, 7, 8

[56] References Cited

U.S. PATENT DOCUMENTS

| | | | |
|---|---|---|---|
| 3,465,430 | 9/1969 | Barber et al. | 29/599 |
| 3,534,459 | 10/1970 | Kudo et al. | 505/812 |
| 3,625,662 | 12/1971 | Roberts | 428/930 |
| 3,652,967 | 3/1972 | Tanaka et al. | 29/599 |
| 3,665,595 | 5/1972 | Tanaka et al. | 505/921 |
| 3,728,165 | 4/1973 | Howlett | 505/818 |
| 4,414,428 | 11/1983 | McDonald | 174/126 |
| 4,803,310 | 2/1989 | Zeitlin et al. | 29/599 |
| 4,959,272 | 9/1990 | Tanaka et al. | 428/614 |
| 4,973,527 | 11/1990 | Smathers | 428/930 |

FOREIGN PATENT DOCUMENTS

| | | | |
|---|---|---|---|
| 45584 | 2/1982 | European Pat. Off. | 29/599 |

OTHER PUBLICATIONS

"Restricted Novel Heat Treatments For Obtaining High $J_c$ IN Nb46.5wt%Ti" P. J. Lee, J. C. McKinnell and D. C. Larbalestier, App. Superconductivity Ctr. Univ. Wisconsin (1990).

"Current-Carrying Capacity of Superconductors with Artificial Pinning Centers" G. L. Dorofejev, E. Yu. Klimenko S. V. Frolov, Kurchatov Inst. of Atomic Energy, Moscow, USSR (1985).

"Properties Of Superconducting NbTi Superfine Filament Composites With Diameters" <0.1μm I. Hlasnik et al, Apr. 1985 Electrotechnical Institute, Electro--Physical Research Centre, Slovak Academy of Sciences, Bratislava, Czechoslovakia.

"NBTI Superconductors With Artificial Pinning Structures" Supercollider 2, Plenum Press, NY 1990 pp. 341-348.

L. R. Motowidlo, P. Valaris, H. C. Kanithi, M. S. Walker and B. A. Zeitlin, IGC Advanced Superconductors, Inc. 1875 Thomaston Avenue, Waterbury, CT 06704.

Primary Examiner—John Zimmerman
Attorney, Agent, or Firm—Hayes, Soloway, Hennessey & Hage

[57] ABSTRACT

In a preferred form of the invention, a superconductor is produced by the steps of combining a plurality of layers of metal sheets to form a composite structure. The sheets are pure transition metals—niobium, titanium, zirconium, or vanadium, alternate sheets being formed of different transition metals. The resulting composite structure is mechanically reduced sufficiently so that each transition metal sheet is less than 1000 Å thick. In the course of reduction, the composite is subjected to sufficient temperatures for sufficient times such that the transition metal layers are partially reacted to form a ductile superconducting material between the transition metal layers. Approximately one half by volume of the transition metal layers remain unreacted. These unreacted layers afford efficient flux pinning within the composite when the layers are reduced to the <1000Å final size. In other embodiments, powders and filaments can be used instead of initial layers.

18 Claims, 6 Drawing Sheets

SUPERCONDUCTOR AND PROCESS OF MANUFACTURE

This application is a continuation-in-part of our co-pending application Ser. No. 07/480,236 filed Feb. 15, 1990, which application in turn is a continuation-in-part of our application Ser. No. 07/363,634, filed Jun. 8, 1989, now U.S. Pat. No. 4,925,741, granted May 15, 1990.

This invention relates to the production of improved superconductors.

BACKGROUND OF THE INVENTION

NbTi has long served as the backbone of the superconducting wire industry. Despite continued research into alternate materials, including the recent surge of interest in high-$T_c$ superconductors, NbTi remains the superconductor of choice. Unfortunately, high quality NbTi wire is difficult to produce, requiring a complicated and time-consuming schedule of heat treatments. A composite material with the promise for rendering such heat treatment schedules unnecessary is desirable.

While a number of heat treatment schedules can be and are currently employed in the production of NbTi conductors, their purpose is the same: to precipitate α-Ti particles in the NbTi. These particles serve as defects capable of pinning flux lines. This pinning in turn allows high $J_c$'s to be achieved. The drawbacks to the heat treatment method of processing are numerous, but may be briefly summarized as follows:

1. The balance between the number and length of heat treatments, the pre-heat treatment strains and heat treatment temperatures is delicate. Hence, optimizing the $J_c$ is difficult, and is vulnerable to errors during the processing of the wire.

2. The need for complicated heat treatment schedules lengthens processing time substantially and increases production costs.

3. The presence of α-Ti decreases the ductility of NbTi; this is manifested in difficulties in obtaining desired conductor piece lengths.

4. Extensive heat treatment introduces Ti-Cu compound formation problems that can only be avoided through the use of barrier materials.

It is well-known that α-Ti precipitates in NbTi greatly enhance $J_c$ due to their ability to serve as flux pinning sites. These precipitates, which form at β-Nb-Ti grain boundaries, are generally created by a series of heat treatments separated by strain resulting from cold deformation. This strain encourages the α-Ti precipitation. A final, larger strain occurs after the last heat treatment. The final strain elongates the α-Ti and allows optimization of the $J_c$.

The particulars of the heat treatment schedule depend upon a number of factors: NbTi composition, homogeneity, etc. However, a typical schedule for the commonly used Nb46.5 wt % Ti will involve three or more 300° C.–450° C. treatments, 40–80 hours in duration separated by areal reductions of approximately 1.6. The final areal reduction is usually in the range of 7–12.

The best of these schedules produces about 20 volume percent of α-Ti in the NbTi and $J_c$'s in excess of 3000 A/mm$^2$ at 5T and 4.2° K. In wires with these properties, the α-Ti is configured in a dense array of ribbons 10–20 Å in thickness, 40–80 Å apart, and with the aspect ratio dependent upon the final strain imparted (see, for example, P. J. Lee, J. C. McKinnell, and D. C. Larbalestier, "Restricted Novel Heat Treatments for Obtaining High $J_c$ in Nb46.5 wt % Ti", To be published, presented as paper #HX-03 at ICMC/CEC, Los Angeles, Calif., Jul. 25, 1989).

Clearly, the heat treatment method of producing pinning sites is not only time consuming but is also open to potentially disastrous errors. If heat treatment times or temperatures are incorrect, or if too much or too little strain is applied, initially good material can be rendered useless. A material that does not require such complicated processing and which reliably yields high $J_c$'s would thus be of tremendous value. Artificially pinned NbTi promises to be such a material.

Work performed several years ago by G. L. Dorofejev, E. Yu. Klimenko, and S. V. Frolov, ("Current-Carrying Capacity of Superconductors with Artificial Pinning Centers", Proceedings of the 9$^{th}$ International Conference on Magnet Technology, MT-9, Swiss Institute of Nuclear Technology, P. 564–6, Zurich, 1985, ISPN 3-907998-00-6,) demonstrated for the first time that transition metals could be utilized as pinning sites in NbTi. These investigators produced wires containing a Nb50 wt % Ti matrix surrounding up to 10$^7$ microfilaments of Nb, Ti, or V. The microfilament spacings were equal to the microfilament diameters. These composites were processed without heat treatment to a variety of sizes for $J_c$ testing. It was found that $J_c$ increased in inverse proportion to the microfilament diameter down to 500 Å. Below this size, mechanical and diffusional effects began to degrade the properties. The best of the composites, incorporating Nb filaments in the NbTi matrix, displayed a $J_c$ of 3500 A/mm$^2$ at 5T and 4.2° K.

Figure 1:
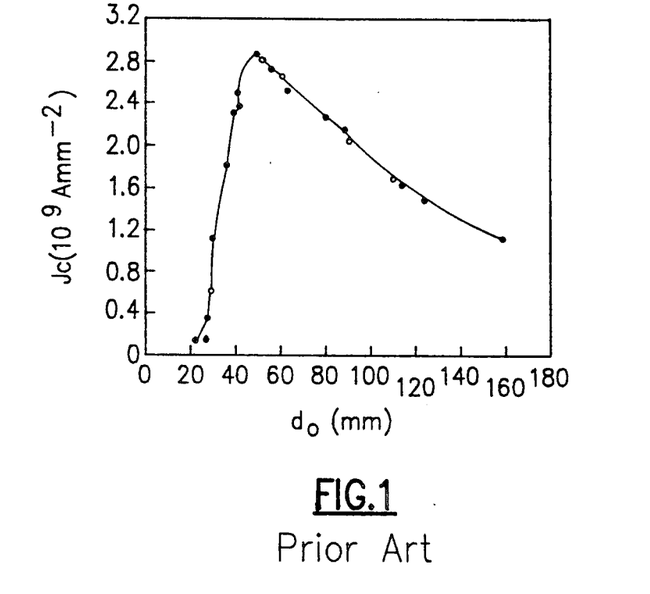
FIG. 1 is from I. Hlasnik et al., "Properties of Superconducting NbTi Superfine Filament Composites with Diameters <0.1 μm", Cryogenics, vol. 25, October, 1985, showing critical current density at 5T and 4.2° K. versus NbTi filament diameter as calculated (0) and as measured experimentally (.).

In work performed by I. Hlasnik et al., ("Properties of Superconducting NbTi Superfine Filament Composites with Diameters <0.1 μm", Cryogenics, vol. 25, October, 1985) Cu-NbTi composites consisting of 9,393,931 NbTi filaments embedded in Cu were fabricated via multiple restacks. No special heat treatments were employed during processing. NbTi filament diameters as low as 200 Å were achieved, along with Cu matrix thicknesses of 100 Å. FIG. 1 shows a plot of critical current density versus filament diameter for a Cu-NbTi composite at 5T and 4.2° K. The peak $J_c$ of approximately 3000 A/mm$^2$ occurs at 500 Å filament diameter and is followed a rapid decline, consistent with the findings of Dorofejev et al.

Figure 2:
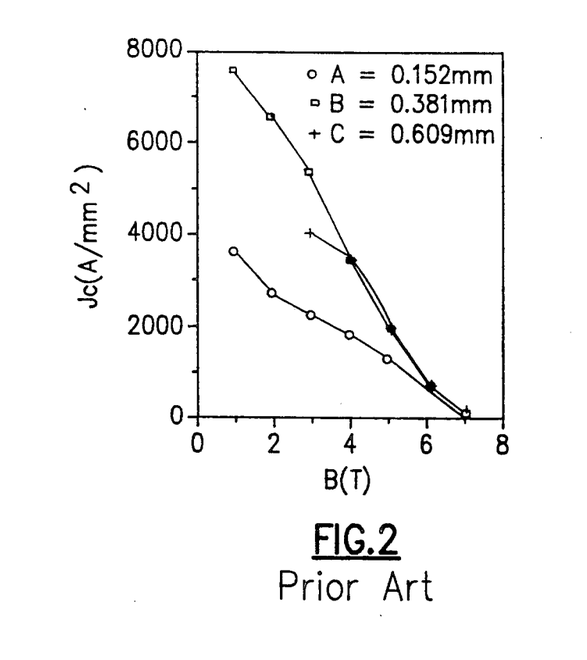
FIG. 2 is from L. R. Motowidlo, H. C. Kanithi, and B. A. Zeitlin, "NbTi Superconductors with Artificial Pinning Structures", To be published, presented as paper #HX-01 at ICMC/CEC, Los Angeles, Calif., Jul. 25, 1989, showing critical current density versus applied magnetic field for three wire sizes corresponding to NbTi dimensions of 237 Å, 592 Å, and 968 Å (A, B, and C, respectively).

Recent work by L. R. Motowidlo, H. C. Kanithi, and B. A. Zeitlin, ("NbTi Superconductors with Artificial Pinning Structures", To be published, presented as paper #HX-01 at ICMC/CEC, Los Angeles, Calif., Jul. 25, 1989, see also U.S. Pat. No. 4,803,310,) transposed the positions of the Nb and NbTi relative to the approach of Dorofejev et al., placing the NbTi within a Nb matrix. Employing multiple restacks, the investigators produced a multifilament wire containing 1250 filaments. Each of these copper clad filaments contained 5800 Nb46.5 wt % Ti cores within a Nb matrix. The Nb and NbTi occupied equal volume fractions within the filaments. By simply drawing the multifilament material down, the investigators achieved $J_c$'s as high as 3700 A/mm$^2$ in a 0.020" diameter wire at 4T and 4.2° K., corresponding to Nb and NbTi dimensions of about 150 Å (matrix thickness) and 670 Å (core diameter), respectively. A plot of $J_c$ versus applied field for several of the wire diameters tested is shown in FIG. 2. These data were taken at 4.2° K. using a standard four point probe and helically wound samples. The voltage taps were separated by 75 cm.

The remarkably good low field behavior found by the investigators is mitigated by the poor high field behavior. $H_c2$ for the material was found to be only about 7.5T, well below that for conventionally processed material (11T). Nonetheless, the experiment clearly demonstrated transition metal pinning.

Older work by Roberts et al. U.S. Pat. No. 3,625,662, Dec. 7, 1971 and MacDonald, U.S. Pat. No. 4,414,428, Nov. 9, 1983, involved the fabrication of superconductors using layered sheet materials, but in neither case did the investigators contemplate the engineering of pinning mechanisms via the manipulation of superconducting and normal metals.

BRIEF DESCRIPTION OF THE INVENTION

The essential elements of the invention comprise the following steps:

1. Creating a composite characterized by a periodic arrangement of at least two different "normal" transition metals so as to provide numerous interfaces between different "normal" transition metals. By "normal" transition metal is meant the transition metals Nb, Ti, Zr, and V.

2. Reaction of the transition metals to form a ductile superconducting alloy at the interfaces of these materials.

3. Limiting the extent of the reaction so as to maintain areas of pure or nearly pure transition metal along with the alloy.

4. Reduction of the composite such that the superconducting and normal metal thicknesses are less than 0.1 μm, where the flux pinning at the superconducting-to-normal interfaces becomes most pronounced.

As a result of the above processing steps, there is created a product whose interfacial area between the two different normal transition metals has been enormously increased and this area has been created under conditions which convert the interface into a diffusion alloy of the two "normal" transition metals, which alloy is superconducting at high magnetic fields.

In one preferred form of the present invention, a superconductor is produced by the steps of wrapping a plurality of layers of metal sheets around a support to form a composite structure. The sheets are preferably pure transition metals—niobium, titanium, zirconium, or vanadium, for example—alternate sheets being formed of different transition metals. The support may be composed of any ductile metal. The resulting composite structure is mechanically reduced sufficiently so that each transition metal sheet is less than 1000 Å thick. In the course of reduction, the composite is subjected to sufficient temperatures for sufficient times such that the transition metal layers are partially reacted to form a ductile superconducting material between the transition metal layers. Approximately one-half by volume of the transition metal layers remain unreacted. These unreacted layers afford efficient flux pinning within the composite when the layers are reduced to the <1000 Å, final size.

The reaction of the transition metal layers should occur when said layers are greater than or equal to 1 μm in thickness and can be brought about by any means appropriate, including but not limited to, hot isostatic pressing, hot extrusion, or heat treatment. By reacting the layers at a relatively large thickness, the reaction can be controlled so that the desired superconducting and normal layer dimensions can be obtained. By contrast, heat treatments applied at final size, when the layers are extremely thin, could not be controlled to the extent necessary to maintain unreacted material. That unreacted layers must be maintained distinguishes this invention from that of Roberts et al., where no such provision is made.

In order to more fully understand the invention, reference should be had to the following detailed description taken in conjunction with the attached drawings, wherein:

DETAILED DESCRIPTION OF THE INVENTION

In a preferred form of the present invention, sheets of pure transition metal are layered and then wrapped around a core. When this material is processed, small layer thicknesses are quickly and easily obtained. During processing, ductile superconducting material is formed at the interfaces of the layered sheets such that approximately one-half of the sheet thicknesses remain unreacted. These unreacted layers of transition metal afford pinning within the composite when reduced to <1000 Å thick. The presence of pinning sites in the composite allows the development of superior $J_c$ at low magnetic field (1T-5T). Here, a pinning site is defined as an interface between normal and superconducting material. In general, the greater the pinning site density within the composite, the better the low field $J_c$.

The thickness of the normal and superconducting layers is critical to the ultimate performance of the composite. If the layer thicknesses are too large, i.e., not on the order of the fluxoid spacing at the particular magnetic field, then inefficient pinning results. On the other hand, if the layers are reduced too much, mechanical and diffusional problems are introduced, as are proximity effects, serving to degrade the critical current density and upper critical field of the composite.

According to the invention, a composite material utilizing alternating layers of transition metal was fabricated as described in the following non-limiting example:

EXAMPLE I

Figure 3:
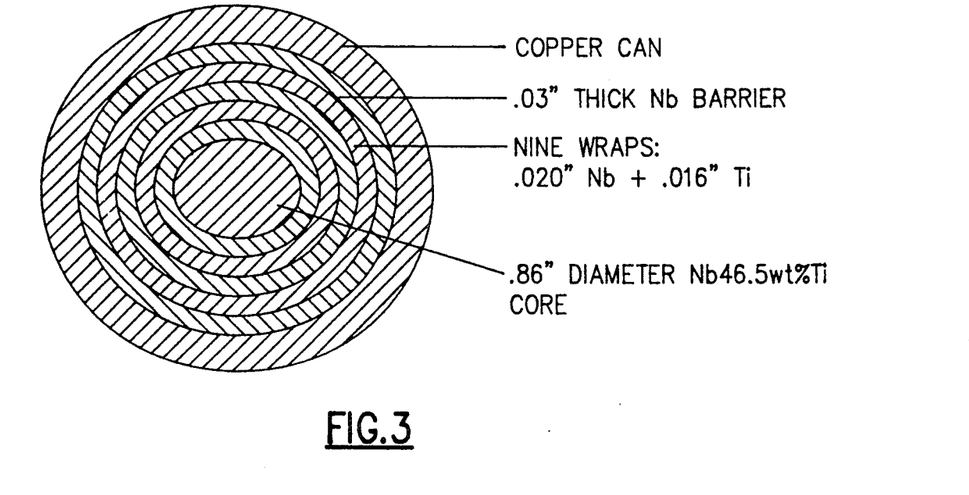
FIG. 3 shows the design of a monofilament billet containing alternating layers of Nb and Ti sheet wrapped around a Nb46.5 wt % Ti core.

The process began by constructing a copper clad monofilament billet containing alternating layers of Nb and Ti around a Nb46.5 wt % Ti core (see FIG. 3). Nb and Ti layers were chosen in the hope that the layers might be reacted at a later point in the processing. The layer thicknesses were selected so that after this reaction, thin layers of unreacted Nb and Ti would remain to act as pinning sites, while the rest of the material would be NbTi alloy. These considerations resulted in a Nb to Ti ratio of 5:4 by volume.

After assembly, the monofilament billet was electron-beam welded shut in vacuum and then hot isostatically pressed at 650° C. for four hours at a pressure of 15 ksi. The billet was then machined to 2.0" in diameter for extrusion. Prior to extrusion, the billet was heated to 650° C., which temperature was maintained for two hours. The billet was then extruded at 650° C. to 0.5" in diameter. The extruded rod was cold-drawn to 0.03" in diameter, at which point the copper jacket was removed and the material was restacked in a Nb lined copper can, the Nb here, as in the case of the monofilament, serving to prevent copper contamination of the material. The new billet thus produced contained almost 4000 filaments within a thin Nb matrix.

Figure 4:
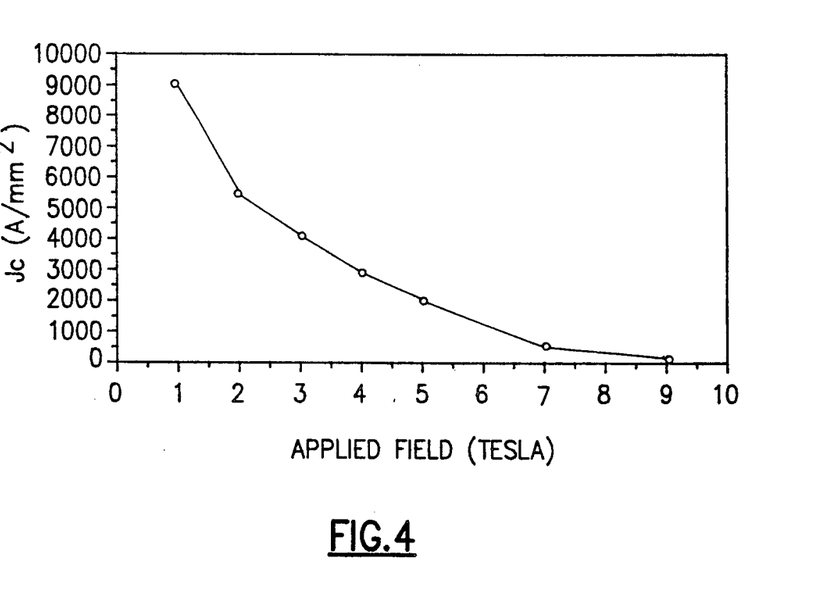
FIG. 4 shows a plot of current density versus applied magnetic field for a 0.0084" diameter Nb/Ti composite fabricated in accordance with the invention.

The restack billet was processed in just the same way as was the monofilament billet, ultimately being drawn to several wire sizes for $J_c$ testing. A standard four point probe was used to measure the $I_c$ of helically wound samples at 4.2° K. The voltage laps were spaced 22 cm apart. FIG. 4 shows a representative $J_c$ versus applied field curve for the non-heat treated Nb and Ti material. Indeed, although the plot is for a 0.0084" diameter wire, the data from the other samples tested (0.0297"–0.0045" diameter) fell very nearly on the same curve. The $J_c$'s were calculated over the filament and Nb matrix areas, excluding both the copper and the outer annulus of Nb that was included as insurance against copper contamination. This annulus, 0.045" thick at the 2.0" restack billet diameter, could easily be eliminated in future designs, and hence was not considered in the $J_c$.

As FIG. 4 shows, the product of Example I displayed remarkably high $J_c$'s considering that only pure Nb and Ti sheets went into the bulk of the composite. The highest 5T $J_c$ measured was 2175 A/mm² for the 0.0084" diameter wire. $H_{c2}$ was estimated at 10.2T. Based on data acquired from a control material that contained only Nb46.5 wt % Ti cores in a Nb matrix, the NbTi core in the wrapped foils was eliminated from the $J_c$ calculations, allowing an estimate of $J_c$ within the Nb and Ti layers. For the 0.0084" wire at 5T and 4.2° K., the $J_c$ in this region was estimated at 3250 A/mm². That these current densities were achieved without special heat treatment implies that some alloying of the Nb and Ti layers must have occurred during processing. Since the processing of both the monofilament and restack billets involved hot isostatic pressing and hot extrusion, there was ample opportunity for NbTi formation.

Figure 5:
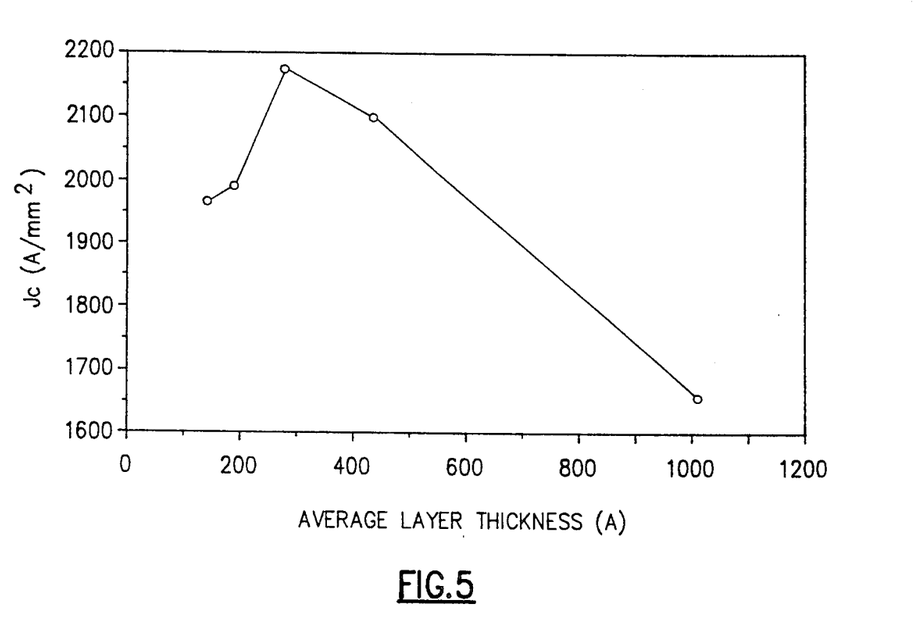
FIG. 5 shows a plot of current density versus average layer thickness (5T, 4.2K) for the Nb/Ti composite fabricated in accordance with the invention. The average layer thickness is the average of the Nb and Ti layer thicknesses at the testing size as extrapolated from the starting sheet thicknesses.

FIG. 5 shows a plot of $J_c$ versus the average layer thickness in the composite, that is, the average of the Nb and Ti layer thicknesses at the testing size as extrapolated from the starting sheet thicknesses (0.018" average). The peak $J_c$ occurred at between 300 Å and 400 Å. Note the similarity between this curve and that produced by Hlasnik et al. (FIG. 1), indicating that the same sort of pinning mechanism is at work.

Figure 6:
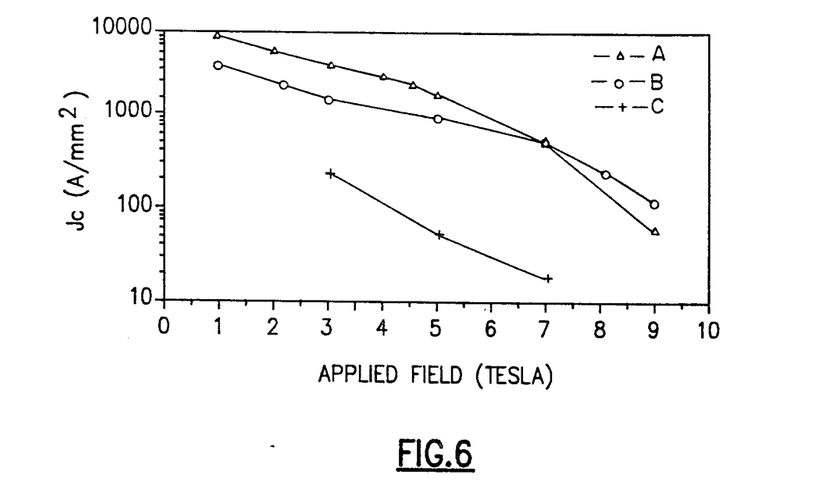
FIG. 6 shows a plot of current density versus applied magnetic field for three 0.0084" diameter samples of the composite fabricated in accordance with the invention: A) Non-heat treated; B) Heat treated (750° C., 1 hr.) at 0.0084"; C) Heat treated (730° C., 1 hr.) at 0.508" followed by drawing to 0.0084".

The application of a 750° C., 1 hour reaction heat treatment—chosen so as to prevent α-Ti formation—was found to reduce $J_c$ for wire diameters ranging from 0.508" to 0.0045". The application of a heat treatment followed by drawing to the sample size tended to increase $J_c$ at that size in the 7-9T range, but $J_c$ remained inferior over the lower field region, where pinning is most important. The plot in FIG. 6 shows these effects. The poor low field $J_c$'s observed suggests that the high temperature heat treatment tended to homogenize the material, thereby lowering the degree of pinning afforded by the Nb and Ti layers.

Figure 7:
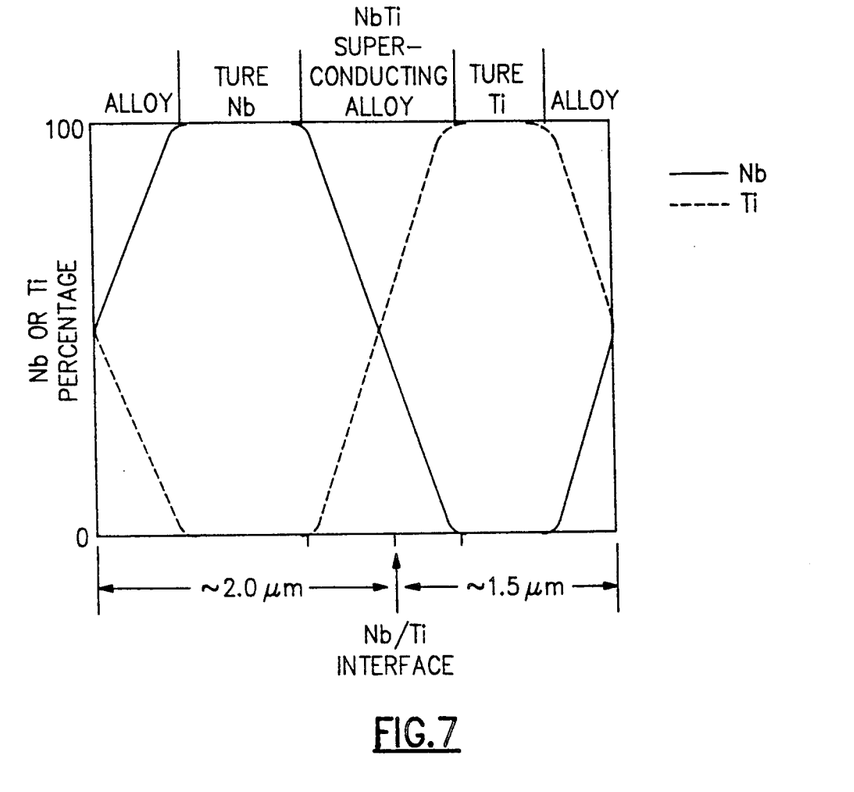
FIG. 7 is a schematic diagram representing the variations in Nb and Ti concentration in the layers of the composite manufactured in accordance with the invention.

An EDS (energy dispersive spectroscopy) examination of the composite at the 0.508" diameter extrusion size revealed that neither the Nb nor the Ti layers were completely reacted, but that significant diffusion had occurred along the Nb/Ti interfaces. This effect is shown schematically in FIG. 7, where the exact extent of the NbTi superconducting region is a matter of definition (i.e., relative to Nb and Ti concentrations). Both the Nb and Ti contribute to the flux pinning in the composite.

Other methods of practicing the invention are set forth in the following non-limiting examples:

EXAMPLE II

Figure 8:
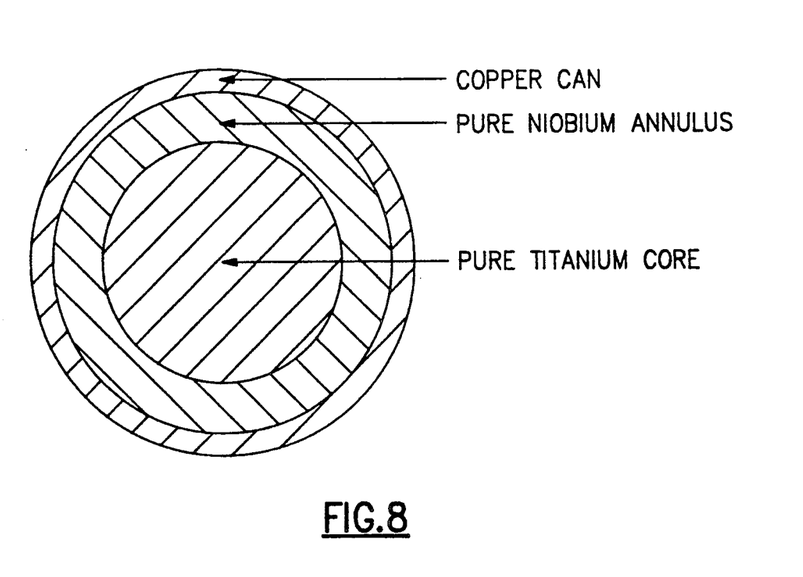
FIG. 8 is a schematic diagram of a monofilament billet containing a Ti core surrounded by an annulus of Nb.
Figure 9:
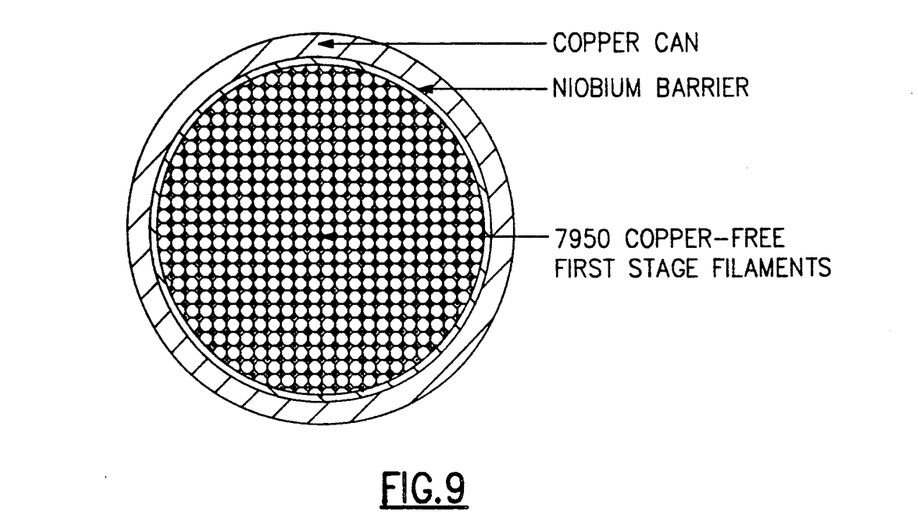
FIG. 9 is a schematic diagram of a second stage monofilament billet containing filaments produced from the billet of FIG. 8.

The monofilament billet shown in FIG. 8 is suited to the production of multifilament wire having more than 4500 6 μm diameter filaments. To produce wire of this kind, two first stage and two second stage monofilament billets must be constructed and processed. Each of the first stage monofilament billets contains a 24" long solid Ti ingot surrounded by an annulus of Nb that can either be built up from sheet or machined from a solid. As the figure indicates, each Nb/Ti assembly is inserted into a thin Cu can. The cans are welded shut and then evacuated. The billets are prepared for extrusion by heating them at 650° C. for 3 hours. They are then extruded at 650° C. from a 7.125" diameter liner to 1.00" in diameter. The extrusions are cropped to remove the excess copper at the noses and tails and are then cold-drawn to 0.063" flat-to-flat hexagonal wire. This material is cut into 22" long filaments. Nitric acid is used to pickle off the copper on the filaments prior to assembly of the second stage monofilaments. (Because the copper cladding is so thin, the Nb on the filaments will have the hex shape that helps to minimize void space in restacked billets.) The design of the second stage monofilament is shown in FIG. 9. Two such billets are assembled, each as follows: The copper can is lined with a Nb barrier to prevent copper contamination during processing. Approximately 7950 of the copper-free filaments are assembled into an hexagonal close-packed array. The copper can, with the barrier, is slipped into position around this array. After the two billets have been assembled, their noses and tails are attached via electron beam welding in vacuum. The billets are then hot isostatically pressed (HIP'd) at 650° C. and 15 ksi for 4 hours. Prior to extrusion, the billets are machined to 7.05" in diameter. Next, they are preheated, extruded, and cropped in the same way as the first stage billets. The 1.0" extrusion is drawn to 0.1083" flat-to-flat hexagonal wire. OFHC copper is also drawn to hexagonal wire at this size. These materials are then cut into 35" lengths for incorporation in the mulifilament billet.

Figure 10:
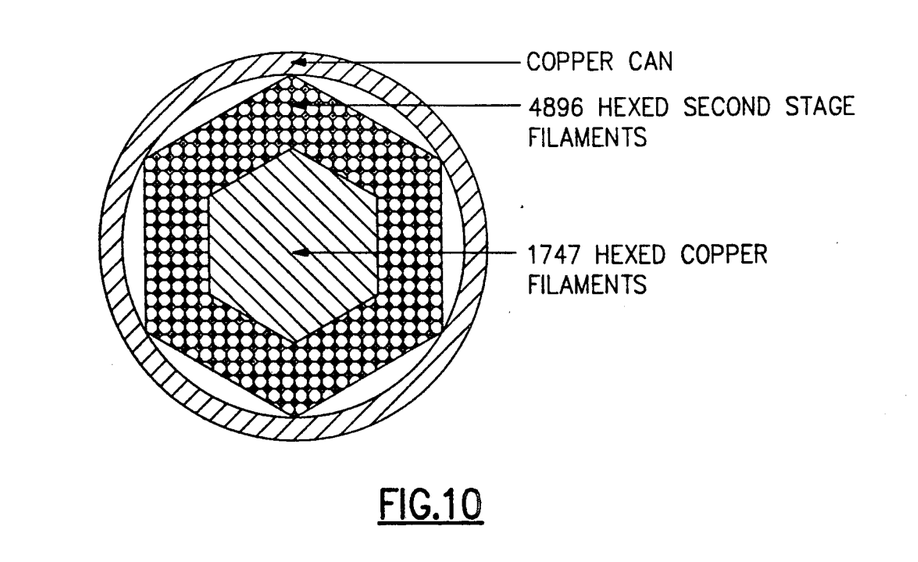
FIG. 10 is a schematic diagram of a multifilament billet containing filaments produced from the billet of FIG. 9.

The design of the multifilament billet is shown in FIG. 10. After cleaning, the hexed copper and second stage filaments are assembled as an array having the proportions indicated by the figure. The copper can is slipped into position around the array and copper filaments are packed at the perimeter to ensure a tight fit in the can. After the nose and tail have been attached via electron beam welding in vacuum, the multifilament billet is HIP'd at 650° C., 15 ksi for 4 hours. The billet is machined to 9.85" in diameter, resulting in a copper-to-non-copper ratio of 1.3:1 by volume, ensuring adequate electrical and thermal stability. The billet is preheated at 650° C. for 3 hours and is then extruded at 650° C. from a 10.0" diameter liner to 2.5" in diameter. This extrusion is cropped and then drawn to a 0.0255" diameter final wire size.

This processing scheme will result in wire with 6 $\mu$m diameter filaments, each filament being composed of $\sim$300 Å diameter Ti sub-filaments in a NbTi matrix. The NbTi composition will be about Nb30 wt % Ti depending on the extent of diffusion. The interfaces between the NbTi and the Ti serve as flux pinning sites in the final composite.

Configurations of Nb and Ti other than that described here could easily be utilized to good effect. For example, the positions of the Nb and Ti in the first stage monofilament could be reversed. The relative amounts of Nb and Ti could also be varied to suit a particular application. To reduce the number of extrusions, the first stage monofilament billet might incorporate a solid Nb (or Ti) matrix with a number of holes drilled through it to accept Ti (or Nb) rods. With a sufficient number of rods, one could avoid the second stage monofilament and go straight to multifilament fabrication. None of these variations constitutes a major departure from the essentials of the invention.

A processing scheme like that described above can be used to produce any composite wherein NbTi is accompanied by nearly pure Nb, Ti, or both Nb and Ti. In particular, it should be mentioned that one could create a composite which, after processing, contains NbTi filaments in a Nb matrix—i.e., the composite initially contains Ti filaments which, in the course of processing, are fully reacted with a Nb matrix. A composite containing NbTi filaments in a Nb matrix is described in U.S. Pat. No. 4,803,310, held by Intermagnetics General Corporation. The U.S. Pat. No. 4,803,310 patent in no way contemplates the reaction of pure transition metals to form the artificially pinned composite. Indeed, in referring to the equivalent of the Nb annulus in FIG. 8, the U.S. Pat. No. 4,803,310 patent explicitly states (section 2, lines 47 and 48) that the "metal used should be one that will not diffuse, or will diffuse only nominally, into the core filaments." This requirement is in stark contrast to the processing demands of the present invention. Of course, in the more general case, where the core material is not fully reacted during processing, the resulting composite will be completely unlike that described in the U.S. Pat. No. 4,803,310 patent.

EXAMPLE III

Another method by which to produce the periodic structure in the composite is via powder metallurgy. Depending upon the shapes of the powder grains, a mix of transition metal powders becomes, after sufficient elongation, a complex array of filamentary or ribbon structures. Although such a system is intrinsically less ordered than the sheet or filament systems discussed previously, it nonetheless possesses the layering characteristic of the invention.

A preferred method of fabrication utilizing powders is as follows:

1. Obtain the chosen transition metal powder—Nb and Ti, for example. The powder grains should be spherical so that filament thicknesses can be predicted with some accuracy. Powders fabricated by the rotating electrode process are nearly spherical, and so are suitable for this application. The powder grains must be relatively large (150 m in diameter) so that one can avoid oxygen contamination problems brought about by too great a surface-to-volume ratio in the grains. The grain size should be the same for all constituent powders.

2. Mix the powders in the appropriate ratio. For Nb and Ti, the ratio is approximately 1:1 by volume.

3. Compress the powder mixture into a copper can lined with a diffusion barrier. The diffusion barrier is necessary to prevent copper contamination in the powder core. Obviously, the barrier material must be one (Nb or Ta, for example) that does not react with copper. The powder mix may be pressed into the can by any mechanical means, provided that the method in no way contaminates the powder.

4. After the can is sealed in vacuum, it is hot isostatically pressed (HIP'd) at a temperature, pressure, and time sufficient to ensure maximum densification of the powder mix. For a Nb and Ti system, 650° C., 15 ksi for 4 hours is an adequate HIP.

5. Machine a solid core of the powder mix out of the HIP'd assembly. Insert this core into a copper extrusion can lined with a diffusion barrier composed of the same material as was used in the HIP can.

6. From this point on, the processing is the same as for the earlier example I composite, including restack, except that the monofilament billet is not HIP'd, since its core is already fully dense. The final wire size will be that at which the filaments in the composite are less than 0.1 $\mu$m thick as extrapolated from the original powder size.

EXAMPLE IV

The powder metallurgy approach has several drawbacks. Most significant is the fact that oxygen contamination resulting in processing difficulties is always a threat. In addition, one cannot precisely control particle sizes or distributions. An alternative approach, one that circumvents these problems, is the use of chopped wire instead of powder.

Figures 11A, 11B:
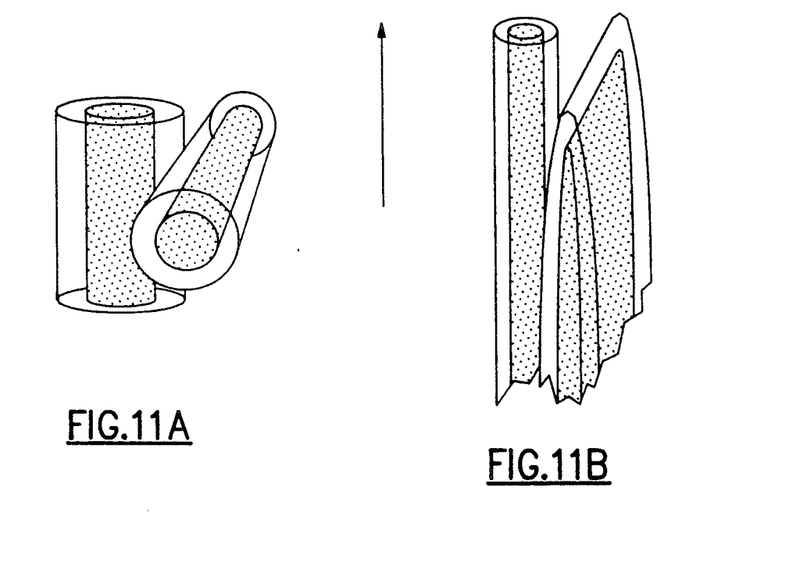
FIGS. 11A and 11B are diagrams showing the effect of elongation on two segments of chopped, copper-free monofilament wire of the type shown in FIG. 8.

There are two ways in which chopped wire can be used to create the necessary layered structure. The first technique is to obtain wires made of the required transition metals, chop them into pieces, and mix them in the right proportions for incorporation into a monofilament extrusion can. The second technique is to fabricate a monofilament wire containing one or more layers of the necessary transition metals, chop it up at the appropriate size, and put the pieces into the extrusion can. This latter method has the advantage that achieving a good mix of materials is not a problem, since every segment of wire contains the correct ratio of metals. Elongation of this type of composite results in a dense, convoluted mix of filaments, ribbons, and elements with morphologies that are somewhere in between. FIGS. 11A and 11B show this effect schematically. FIG. 11A shows two segments of wire of the type shown in FIG. 8.

The segments are orthogonally oriented, as many of the segments in the monofilament would be. FIG. 11B shows the effect of elongation in the direction of the arrow; one segment forms a ribbon while the other remains a filament. The chopped wire approach thus represents a combination of the three systems described previously: sheet, filament, and powder.

Regardless of the type of wire to be used in the monofilament, it should be chopped into segments having a length-to-diameter ratio of about 1:1. The wire diameter should be greater than 0.01" in order to gain a surface-to-volume advantage over powders. The monofilament can must be lined with a diffusion barrier to prevent copper contamination. Assembly and processing is the same as for the Example III composite, except that the monofilament is simply HIP'd and extruded rather than going through the separate densification HIP. While it is desirable to extrude a fully densified core and thereby maximize the yield, the relatively large segments of chopped wire are unlikely to bond sufficiently during a HIP to allow the subsequent machining of a solid core.

Another method of providing extended interfacial areas between adjacent "normal" transition metal bodies is to stack alternate sheets thereof together with reduction and appropriate heat treatment to create the diffusion layer of superconductor. The sheets can be folded, slit and otherwise treated to give almost any final desired arrangement of interfaces. Other mechanical combining, reducing and heat treating steps may be used to create the desired diffusional area of superconducting alloy.

We claim:

1. A method for producing a superconductor comprising the steps of combining a plurality of metal bodies to form a composite structure, said metal bodies being selected from the transition metals niobium, titanium, zirconium and vanadium, alternate bodies being formed of different transition metals to form pairs, reacting the transition metals to cause diffusion of at least one metal into the other metal to form a ductile superconducting alloy as a result of this diffusion, limiting the extent of the reaction so as to maintain the cross-sectional thickness of pure or nearly pure essentially undiffused transition metal along with the superconducting alloy in at least one of each said pair of transition metals which is about equal to the thickness of diffused superconducting alloy, with a partially diffused zone separating each superconducting zone from each undiffused zone, mechanically reducing the composite structure and providing further diffusion to produce a superconducting layer in contact with a non superconducting layer in each said pair, each said layer being less than 1000 Å thick.

2. The process of claim 1 which includes the step of compacting the interfaces between said bodies to provide a metal-to-metal bond between said bodies prior to reacting the transition metals to form the ductile superconducting alloy.

3. The method of claim 1 wherein the mechanical reduction is accomplished under pressure, temperature and time conditions to create a superconducting diffusion zone at each said interface which is about half as thick as each said transition metal layer.

4. The method of claim 1 wherein the mechanical reduction is accomplished under pressure, temperature and time conditions to create a superconducting diffusion zone at each said interface which is about half as thick as each said transition metal layer so that each diffusion zone is separated from the nearest adjacent diffusion zone by a thickness of undiffused transition metal about equal to the thickness of the diffusion zone.

5. The method of claim 1 which includes the steps of mechanically reducing the thickness of said layers sufficiently so that each diffusion zone is less than about 500 Angstroms thick and each undiffused zone is about equal in thickness to the diffusion zone.

6. The method of claim 1 wherein said metal bodies comprise (a plurality of) alternate layers of different transition metals.

7. The method of claim 1 wherein said metal bodies comprise a mixture of powders of at least two transition metals.

8. The method of claim 1 wherein said metal bodies comprise a mixture of short filaments of at least two transition metals having a length to diameter ratio of less than 10.

9. The method of claim 1 wherein said metal bodies comprise a plurality of filaments comprising a core of one transition metal surrounded by another transition metal.

10. A superconducting wire made by the process of claim 1.

11. A superconducting wire made by the process of claim 2.

12. A superconducting wire made by the process of claim 3.

13. A superconducting wire made by the process of claim 4.

14. A superconducting wire made by the process of claim 5.

15. A superconducting wire made by the process of claim 6.

16. A superconducting wire made by the process of claim 7.

17. A superconducting wire made by the process of claim 8.

18. A superconducting wire made by the process of claim 9.

* * * * *

UNITED STATES PATENT AND TRADEMARK OFFICE
CERTIFICATE OF CORRECTION

PATENT NO. : 5,160,794

DATED : November 3, 1992

INVENTOR(S) : James WONG, Mark K. RUDZIAK and Donald W. CAPONE, III

It is certified that error appears in the above-identified patent and that said Letters Patent is hereby corrected as shown below:

Claim 1, Col. 9, Line 54, "and" should read --or--.

Signed and Sealed this

Twenty-eighth Day of June, 1994

*Attest:*

BRUCE LEHMAN

*Attesting Officer*     *Commissioner of Patents and Trademarks*